(12) United States Patent
Tanner et al.

(10) Patent No.: US 7,900,843 B2
(45) Date of Patent: Mar. 8, 2011

(54) PROXIMITY PAYMENT CARD WITH USER-ACTUATED SWITCH AND METHODS OF MAKING THE CARD

(75) Inventors: Colin Tanner, Middlesex (GB); Stephen Marshall-Rees, Andover (GB)

(73) Assignee: MasterCard International, Inc., Purchase, NY (US)

( * ) Notice: Subject to any disclaimer, the term of this patent is extended or adjusted under 35 U.S.C. 154(b) by 1244 days.

(21) Appl. No.: 11/503,197

(22) Filed: Aug. 11, 2006

(65) Prior Publication Data

US 2008/0035740 A1 Feb. 14, 2008

(51) Int. Cl.
*G06K 19/06* (2006.01)
(52) U.S. Cl. ............ 235/492; 235/380; 235/487; 705/14
(58) Field of Classification Search .................. 235/492, 235/380, 487; 705/14
See application file for complete search history.

(56) References Cited

U.S. PATENT DOCUMENTS

| | | | | |
|---|---|---|---|---|
| 3,927,282 | A * | 12/1975 | Firstenberg | 379/447 |
| 5,821,516 | A * | 10/1998 | Vandenengel | 235/441 |
| 6,863,220 | B2 | 3/2005 | Selker | |
| 7,012,504 | B2 | 3/2006 | Tuttle | |
| 2002/0170960 | A1* | 11/2002 | Ehrensvard et al. | 235/380 |
| 2006/0137464 | A1 | 6/2006 | Baudendistel | |
| 2006/0252601 | A1* | 11/2006 | Baum | 482/9 |
| 2008/0054081 | A1* | 3/2008 | Mullen | 235/494 |
| 2008/0065492 | A1* | 3/2008 | Halbur et al. | 705/14 |
| 2008/0149735 | A1* | 6/2008 | Kozlay | 235/492 |

FOREIGN PATENT DOCUMENTS

| | | |
|---|---|---|
| DE | 195 00 925 A1 | 7/1996 |
| DE | 19645083 A1 | 5/1998 |
| DE | 19742126 A1 | 3/1999 |
| DE | 10140662 C1 | 3/2003 |
| EP | 1 544 787 A1 | 6/2005 |
| EP | 1 868 140 A1 | 12/2007 |
| WO | WO 98/33193 A1 | 7/1998 |
| WO | WO 99/38173 A1 | 7/1999 |
| WO | WO 00/79546 A1 | 12/2000 |

OTHER PUBLICATIONS

European Patent Office "Supplemental European Search Report", dated Aug. 13, 2009, for EP Patent Application No. 07840863.0—2210 / 2055034—PCT/US2007/075707, 6pgs.
"PCT Notification of Transmittal to the International Search Report or the Declaration", dated Mar. 17, 2008 for PCT/US07/75707, 2pgs.
European Communication pursuant to Article 94(3) EPC, dated Jan. 22, 2010, for EP Patent Application No. 07840863.0—2210, 3pgs.

* cited by examiner

*Primary Examiner* — Allyson N Trail
(74) *Attorney, Agent, or Firm* — Buckley, Maschoff & Talwalkar LLC

(57) ABSTRACT

A radio frequency identification (RFID) module for an identification token includes a module body and an RFID integrated circuit (IC) mounted on or in the module body. The RFID module also includes a pressure-sensitive switching device mounted on or in the module body. An identification token may be manufactured using the RFID module as a component of the identification token, so that the proximity payment device includes a user-actuatable switch without requiring separate operations to incorporate the switch during assembly of the identification token.

15 Claims, 8 Drawing Sheets

US 7,900,843 B2

PROXIMITY PAYMENT CARD WITH USER-ACTUATED SWITCH AND METHODS OF MAKING THE CARD

BACKGROUND

It has been proposed (e.g., in U.S. Pat. No. 6,863,220) to include a user-actuated switch in a proximity payment card so that the card may be in an unactivated state except when the user actuates the switch while presenting the card for reading by a point of sale terminal. By requiring a user to actuate a switch in order to activate the card, it may be possible to prevent certain attacks on the security of the card account number. Such attacks may occur by surreptitiously reading the card from a distance while the card is in the holder's purse or wallet.

A possible disadvantage of proposed designs for a proximity payment card having a user-actuatable switch is that the resulting cards may be unduly expensive to manufacture.

DETAILED DESCRIPTION

In general, and for the purpose of introducing concepts of embodiments of the present invention, a suitable switch, such as one that operates by sensing pressure from the user's finger, may be incorporated in an RFID module that is used as a constituent part of a proximity payment card. Using such an RFID module may reduce the over-all manufacturing cost of a proximity payment card which is to include a user-actuated switch. For example, if an RFID module that incorporates a switch is used as a component of the proximity payment card, it may be possible to minimize or eliminate changes in the card manufacturing process that would otherwise be required (after manufacture of the RFID module) to include a switch on the card. In some aspects, the so-called "inlay" portion of the proximity payment card may include a pressure-sensitive switch as well as a conventional RFID integrated circuit (IC or "chip") and a conventional antenna.

Figure 1:
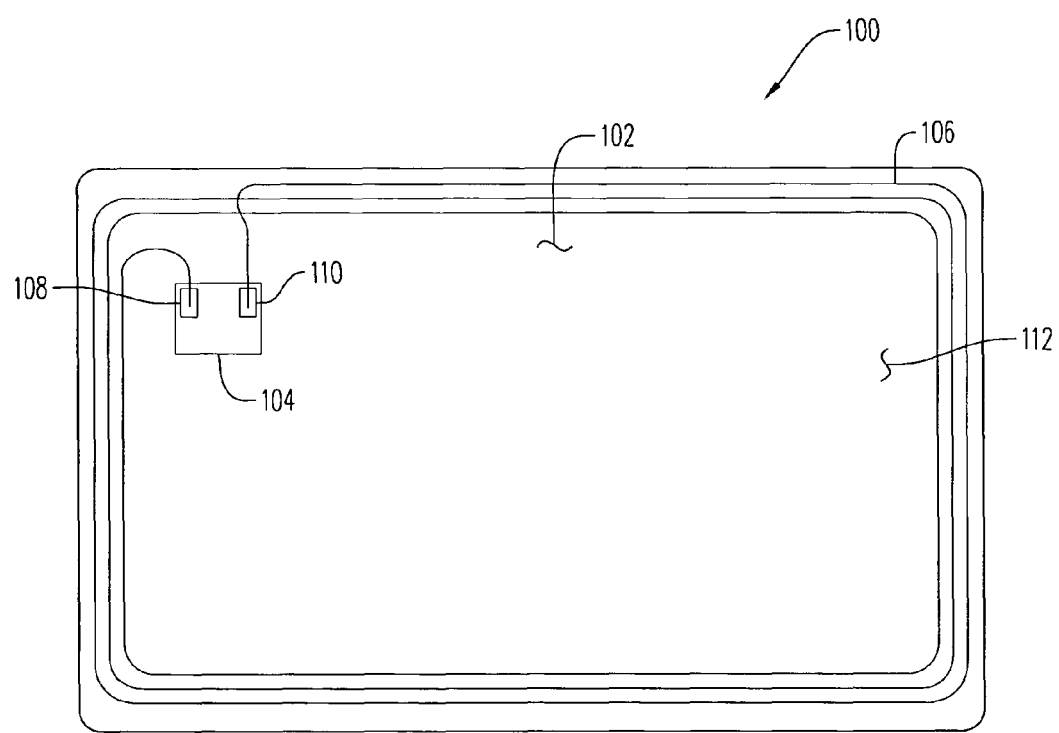
FIG. 1 is a schematic plan view of a proximity payment card according to some embodiments.

FIG. 1 is a schematic plan view of a proximity payment card 100 according to some embodiments. The proximity payment card 100 may include a card-shaped body 102, which may resemble conventional payment cards in shape and size. The card-shaped body 102 may be formed of plastic or another suitable material.

The proximity payment card 100 may also include an RFID module 104. The RFID module 104 may be mounted and/or installed in any suitable manner in the card-shaped body 102. The RFID module 104, which will be described in further detail below, may be suitably designed and configured to transmit payment card account information by radio frequency signaling to a POS terminal. In general, the RFID module 104 may be designed and configured to operate in accordance with the "PayPass" standard promulgated by MasterCard International Incorporated, the assignee hereof.

The proximity payment card 100 may further include an antenna 106 embedded or otherwise mounted on the card-shaped body 102. As shown, the antenna 106 may be in the form of several loops arranged along the periphery of the card-shaped body. Alternatively, the antenna 106 may be of a different type and/or configuration. The antenna may be operative generally in accordance with the above-mentioned PayPass standard to receive interrogation and power signals (which may be the same signal) from a proximity coupling device of a POS terminal and to transmit payment card account number information and/or other information to the proximity coupling device.

Returning to the RFID module 104, it will be noted that it includes electrically conductive contact pads 108, 110, by which the RFID module 104 is electrically conductively connected to the antenna 106.

In some embodiments, lettering (not shown) or other symbols (not shown) may be present on the front surface 112 of the card-shaped body 102 and/or on the rear surface (not shown) of the card-shaped body 102. The proximity payment card 100 may have one or more magnetic stripes (not shown) on the card-shaped body 102 to allow the proximity payment card 100 to be read by a magnetic card reader. In addition, or alternatively, there may be embossed numbers and/or letters on the card-shaped body to indicate one or more account numbers and/or the name of the holder of the proximity payment card 100. In addition, or alternatively, non-embossed printing on the front surface 112 may indicate the account numbers and/or the holder's name. Still further, the front surface 112 of the card-shaped body 102 may carry one or more logos and/or brands, including for example the brand/logo of a national payment card association such as MasterCard International Incorporated. The brand/logo of the issuer may also be present, as well as, for example, a specific card product brand. Other conventional features that may be present on the proximity payment card 100 (though such features are not shown) are an adhesive paper strip to receive the signature of the cardholder, and a security code or the like printed on the adhesive strip.

Figure 2:
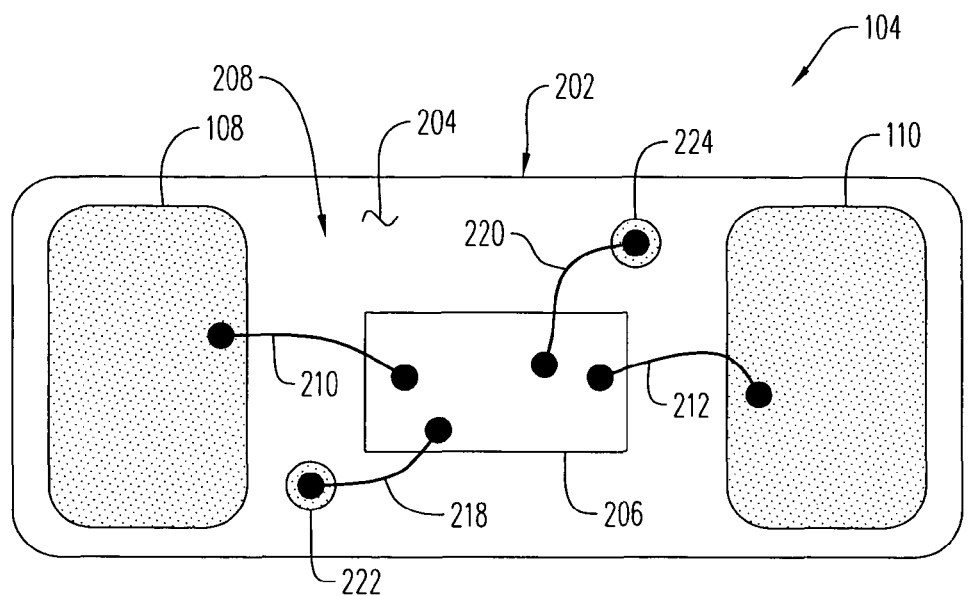
FIG. 2 is schematic top plan view of an RFID (radio frequency identification) module that may be part of the proximity payment card of FIG. 1.
Figure 3:
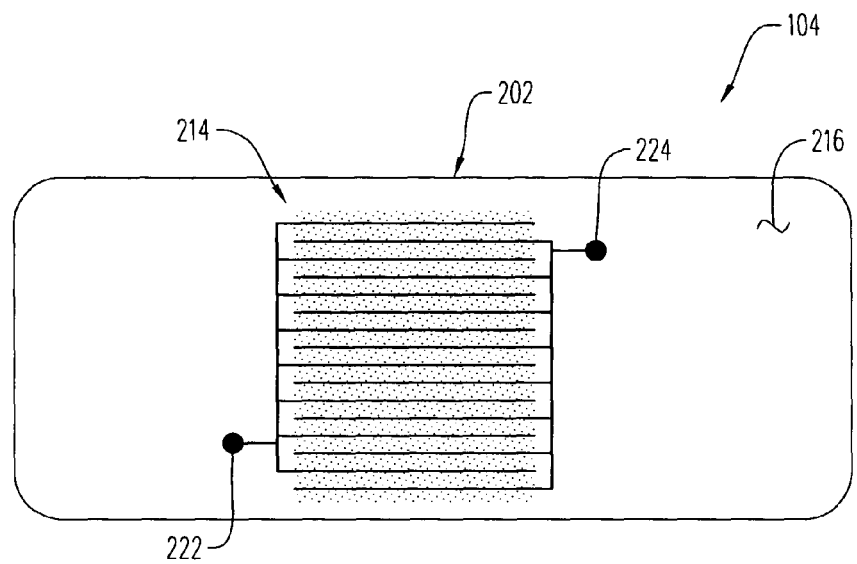
FIG. 3 is a schematic bottom plan view of the RFID module of FIG. 2.

FIG. 2 is schematic top plan view of an example embodiment of the RFID module 104; FIG. 3 is a schematic bottom plan view of the RFID module 104 embodiment shown in FIG. 2. In FIGS. 2 and 3, the RFID module 104 is shown in isolation from the balance of the proximity payment card 100. For example, the views of FIGS. 2 and 3 may be considered to have been taken at a time prior to installation of the RFID module 104 in the card-shaped body 102.

The RFID module 104 includes a module body 202 on which the above-mentioned electrically conductive contact pads 108, 110 are formed on the top surface 204 of the module body 202. The module body 202 may be formed of any suitable material, such as plastic. The module body 202 may be much smaller in size, say less than one tenth (perhaps about one fiftieth) the size in volume and/or surface area, than the card-shaped body 102 (FIG. 1, not shown in FIG. 2).

The RFID module 104 also includes an RFID IC 206, which may be mounted on the top surface 204 of the module body 202 or otherwise mounted on or embedded in the module body 202. For example, the RFID IC 206 may be mounted on the top surface 204 in a space 208 between the contact pads 108, 110. The RFID IC 206 may be constructed generally in accordance with conventional principles, and may perform all processing and/or data storage functions of the RFID module 104. For example, the RFID IC 206 may store a payment card account number to be transmitted by the antenna 106 when the payment card 100 is presented to and interrogated by a POS terminal. The RFID IC 206 may be electrically conductively coupled to the contact pads 108 and 110 by electrically conductive leads 210, 212, respectively.

Referring now to FIG. 3, the RFID module 104 may also include a switching device 214 mounted and/or formed on the bottom surface 216 of the module body 202. (The depiction of the switching device 214 in FIG. 3 should be considered schematic, and may not accurately represent the actual physical appearance of the switching device 214.) The switching device 214 may be centrally located on the bottom surface 216 of the module body 202 and thus may be directly opposite the location of the RFID IC 206 on the top surface 204. From the illustrations and this description, it will be understood that in this embodiment, the switching device 214 and the RFID IC 206 are on opposite sides of the module body 202. The switching device 214 may be electrically conductively connected to the RFID IC 206 by leads 218, 220 which respectively pass through via holes 222, 224 that are formed through the module body 202.

In some embodiments, the switching device 214 may be formed of a pressure sensitive material such as a quantum tunneling composite (QTC—not separately shown) as described in WIPO publications WO 98/33193, WO 99/38173, WO 00/79546. As would be understood from these publications and the disclosure hereof, pressure from the user's finger applied to the switching device 214 may cause the conductive/non-conductive state of the switching device to change in a manner and/or to a degree that may be detectable by the RFID IC 206.

Figure 2A:
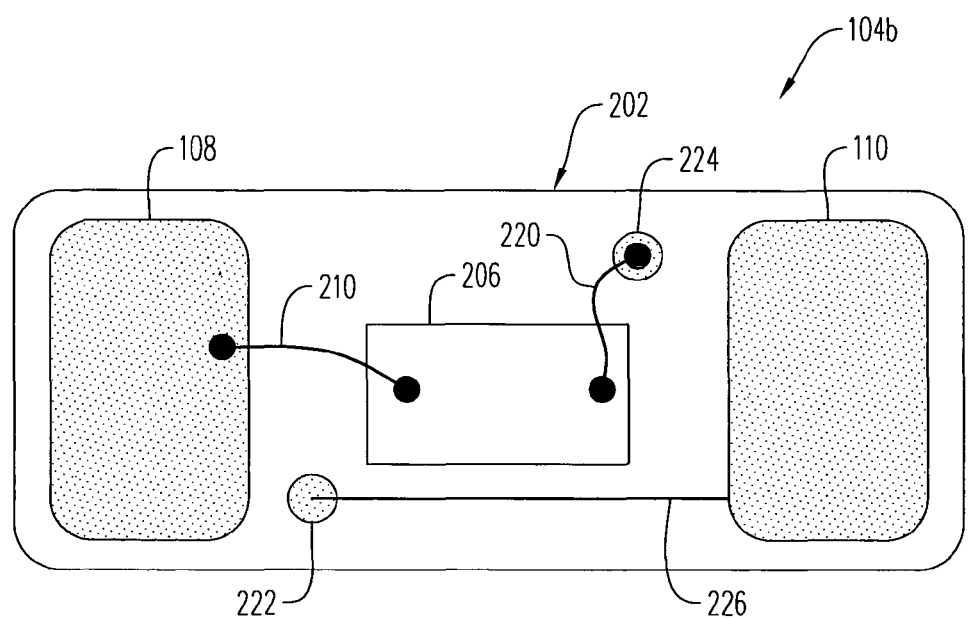
FIG. 2A is a schematic top plan view of another embodiment of the RFID module.

FIG. 2A is a schematic top plan view of another embodiment (indicated generally by reference numeral 104b) of the RFID module. The RFID module 104b of FIG. 2A may differ from the RFID module 104 of FIG. 2 principally in that the RFID module 104b may be configured such that its switch (which may be provided as in FIG. 3) may when actuated complete the conductive connection to the antenna (106 in FIG. 1, not shown in FIGS. 2, 2A) rather than simply providing an input signal to the RFID IC chip 206 as in the RFID module 104 of FIG. 2.

Thus the RFID module 104b may have the same module body 202, contact pads 108, 110, RFID IC 206, via holes 220, 222 and leads 210, 220 as the RFID module 104. However, instead of the leads 212, 218 of the RFID module 104, the RFID module 104b may have a single lead 226 to electrically conductively connect the contact pad 110 to the switching device 214 (FIG. 3, not shown in FIG. 2A) by an electrically conductive connection that passes through via hole 222.

Figure 4:
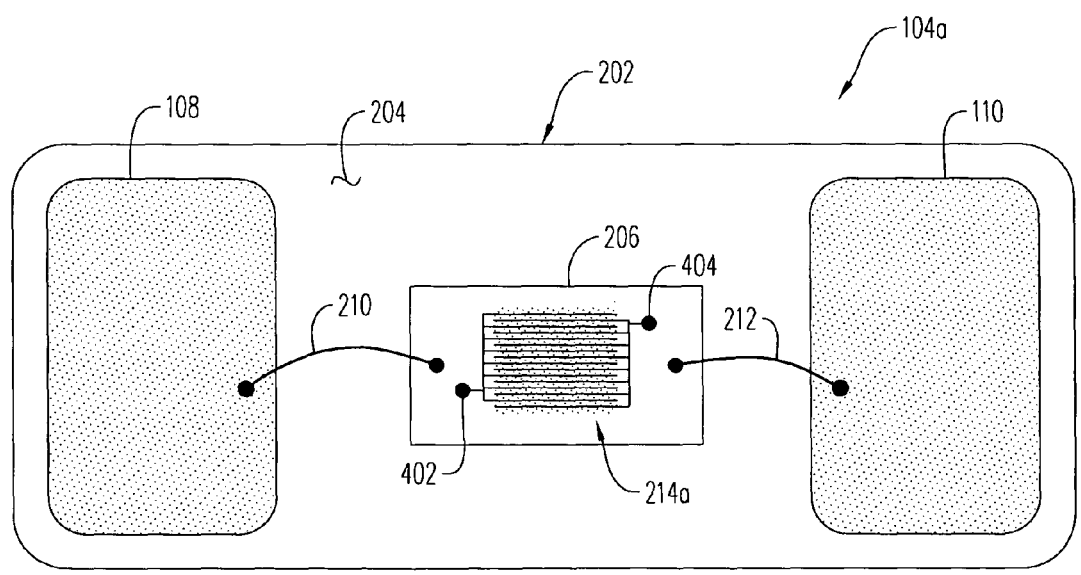
FIG. 4 is a schematic top plan view of still another embodiment of the RFID module.

FIG. 4 is a schematic top plan view of still another embodiment (indicated generally by reference numeral 104a) of the RFID module. The RFID module 104a has the same or a similar module body 202 and electrically conductive contact pads 108, 110 formed on the top surface 204 of the module body 202. The RFID module 104a also includes the same or a similar RFID IC 206 mounted on the top surface 204 of the module body 202 and electrically conductively coupled to the contact pads 108, 110 by electrically conductive leads 210, 212, respectively. The RFID module 104a may differ from the RFID module 104 of FIGS. 2 and 3 in that the RFID module 104a of FIG. 4 may have a user-actuatable switching device 214a formed on the RFID IC 206 and electrically conductively coupled to the RFID IC 206 at 402, 404. As before, the switching device 214a may be a pressure sensitive device formed of QTC so as to be able to sense pressure applied to the switching device 214a by the user's finger.

Figure 5A:
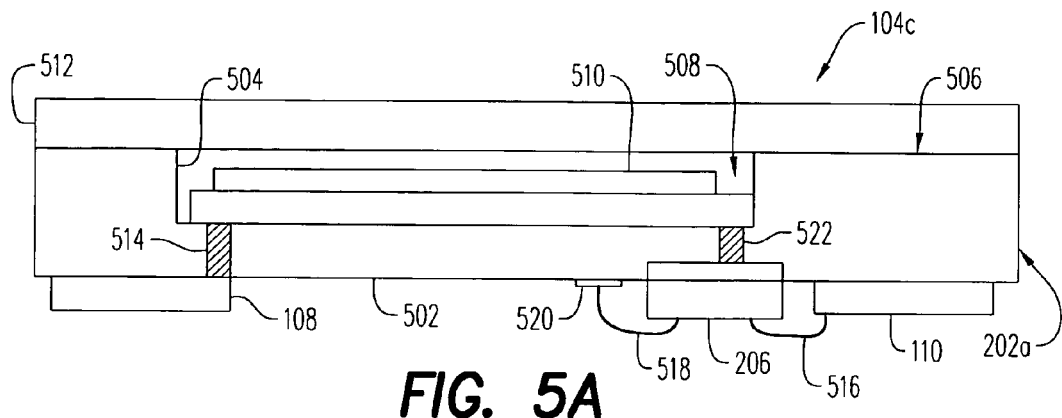
FIG. 5A is a schematic cross-sectional view of yet another embodiment of the RFID module.
Figure 5B:
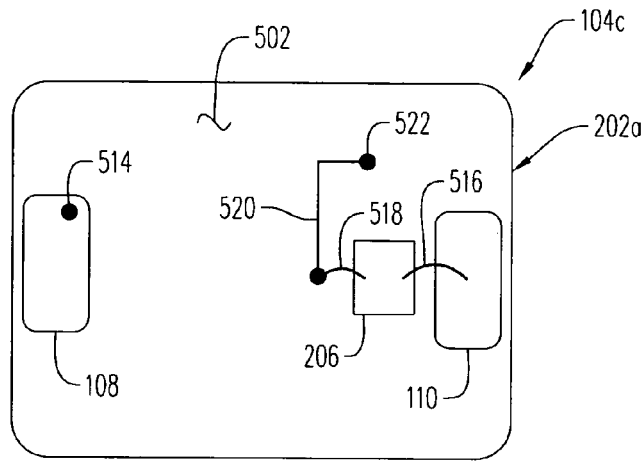
FIG. 5B is a schematic bottom plan view of the RFID module of FIG. 5A.
Figure 5C:
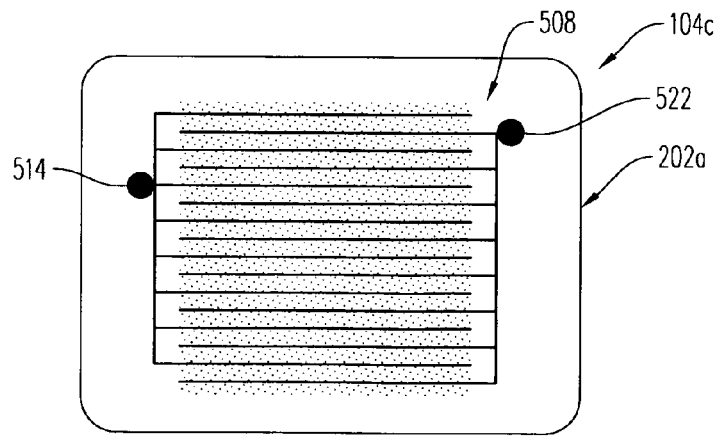
FIG. 5C is a schematic top plan view of the RFID module of FIGS. 5A and 5B.

FIG. 5A is a schematic cross-sectional view of yet another embodiment (indicated generally by reference numeral 104c) of the RFID module; FIGS. 5B and 5C are respectively bottom and top plan views of the RFID module 104c.

In some embodiments the RFID module 104c may have a form factor that substantially matches the form factor of RFID modules used to manufacture so-called "dual interface" cards that comply with ISO/IEC standard 7816 part 1 (promulgated by the International Organization for Standardization). An explanation of the term "dual interface card" is provided below. As will be seen, the RFID module 104c includes a user-actuatable switch. Because the form factor of the RFID module 104c is the same as the form factor of a conventional RFID module for a dual interface card, cards that incorporate the RFID module 104c may be assembled using conventional processes, while including the additional feature of a user-actuatable switch. This approach may allow for a reduction in the manufacturing cost of the card, as compared to cards produced according to previous proposals for cards that include a user-actuatable switch.

The RFID module 104c includes a module body 202a. As will be appreciated from previous discussion, the module body 202a may have substantially the same form factor as an RFID module for a dual interface card. The module body 202a has a lower surface 502, on which electrically conductive contact pads 108, 110 (the same as or similar to contact pads described above with reference to FIGS. 1-4) and an RFID IC 206 (the same as or similar to the RFID IC described above with reference to FIGS. 2-4) are mounted.

A well is formed in an upper surface 506 of the module body 202a. A pressure-sensitive switch 508 is formed in the well 504, and may include a layer 510 of QTC. The RFID module 104c may also include a protective cover 512 positioned on the upper surface 506 of the module body 202a to close the well 504 and to cover the switch 508.

A via hole 514 is formed through the module body 202a to allow for an electrically conductive connection between the switch 508 and the contact pad 108. A lead 516 electrically conductively connects RFID IC 206 to the contact pad 110. A lead 518 electrically conductively connects RFID IC 206 to a trace 520 formed on the lower surface 502 of the module body 502. The trace 520, in turn, is electrically conductively connected to the switch 508 by way of a via hole 522.

Figure 6:
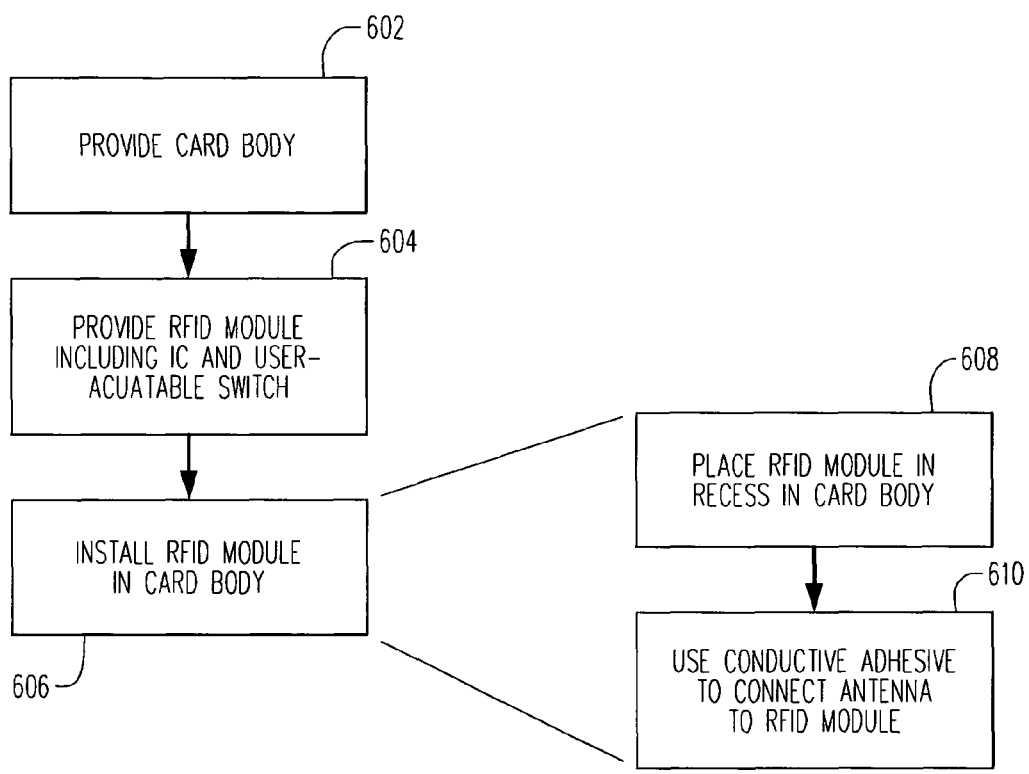
FIG. 6 is a flow chart that illustrates aspects of a method provided for manufacturing a proximity payment card in accordance with some embodiments.
Figure 7:
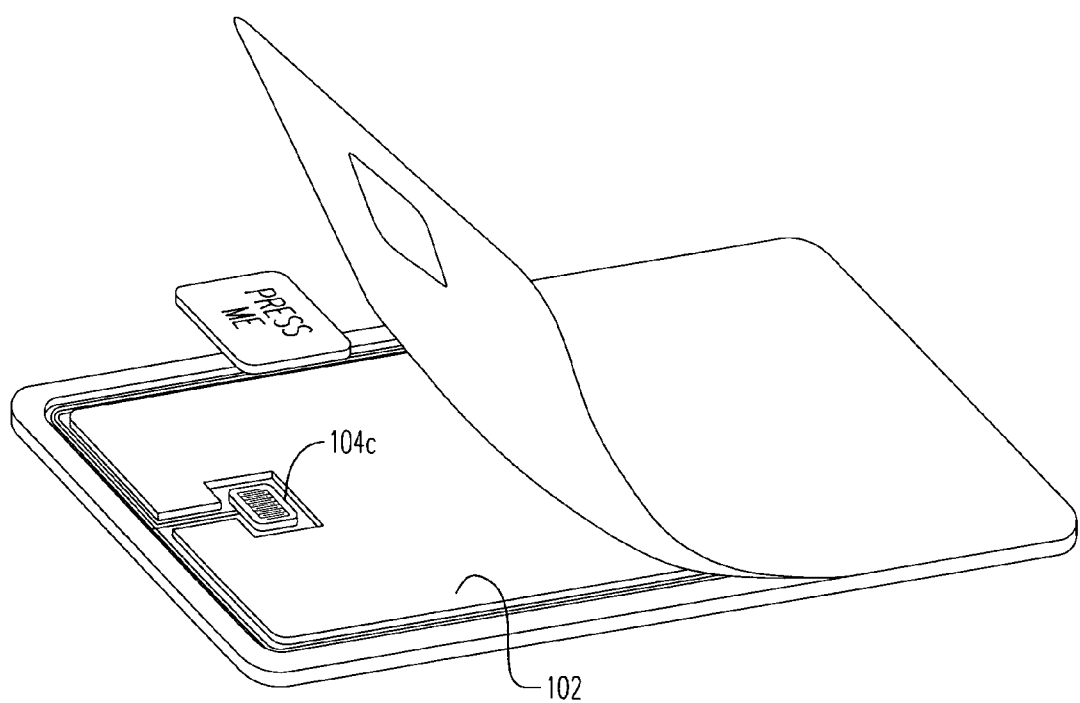
FIG. 7 is a schematic illustration of certain aspects of the method of FIG. 6.

FIG. 6 is a flow chart that illustrates aspects of a method provided according to some embodiments for manufacturing the proximity payment card 100. At 602 in FIG. 6, a card body (e.g., like body 102, FIG. 1) is provided. At 604 in FIG. 6, an RFID module is provided. The RFID module provided at 604 may include a user-actuatable switch and may, for example, be any one of the RFID modules 104, 104a, 104b and 104c shown in FIGS. 2-5C and discussed above. It may be particularly advantageous for the RFID module 104c to be employed in this process, in that the RFID module 104c has the same form factor as conventional RFID modules for dual interface cards, so that the processes of FIG. 6 may correspond to conventional card assembly techniques. At 606 in FIG. 6, the RFID module provided at 604 is installed in the card body provided at 602. As indicated at 608, 610, the installation of the RFID module in the card body may include placing the RFID module in a recess in the card body and using an electrically conductive adhesive to connect the antenna embedded in the card body to the contact pads on the RFID module. FIG. 7 schematically illustrates installation of the RFID module 104b in the card body 102. Other conventional process steps involved in manufacturing a proximity payment card may also occur, though not indicated in FIG. 6. The process illustrated in FIG. 6 may be conventional except in that the RFID module installed in the card may include a user-actuatable switch. Thus a proximity payment card having a user-actuatable switch may be produced without any need to modify the conventional process used to manufacture a proximity payment card that does not have a switch, except as to fabrication of the RFID module. Consequently, the manufacturing cost of the proximity payment card produced as in FIGS. 6 and 7 may be reduced as compared to other proposed approaches to producing a proximity payment card that includes a user-actuatable switch.

Figure 8:
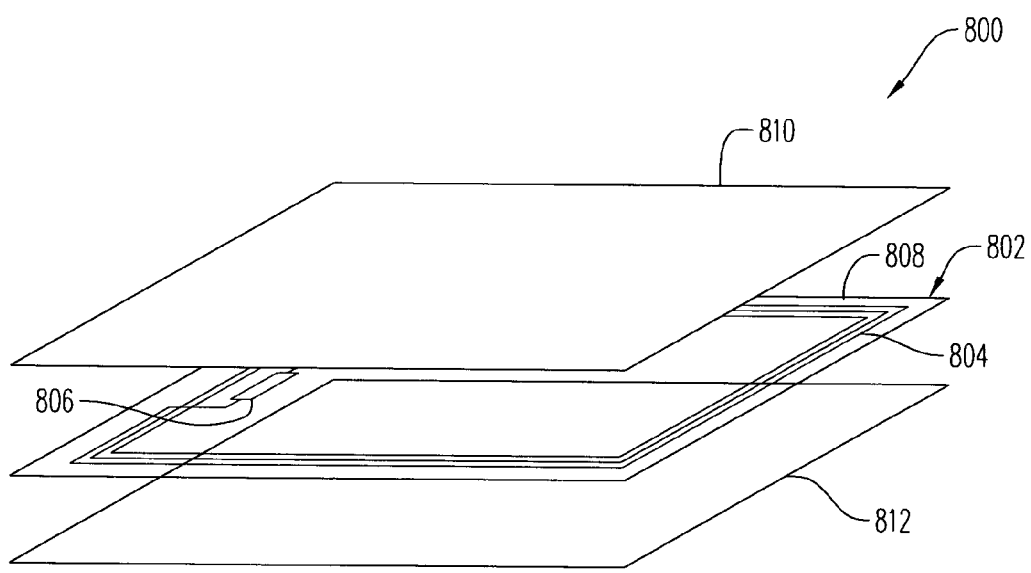
FIG. 8 is a schematic exploded view of a conventional proximity payment card.

FIG. 8 is a schematic exploded view of a conventional proximity payment card 800. The conventional proximity payment card 800 includes a central portion, commonly referred to as an "inlay," as indicated by reference numeral 802 in the drawing. The conventional inlay 802 includes an antenna 804 and an RFID IC 806 mounted in a flexible substrate 808, and thus may include all electrical components and circuitry of the conventional proximity payment card 800. According to conventional practices, the inlay 802 may be bonded between protective layers 810, 812 to form the final configuration of the card 800.

Previous proposals to incorporate a mechanical user-actuatable switch in a proximity payment card may require a substantial departure from the conventional card manufacturing process outlined in the previous paragraph, as well as tending to require an increase in thickness in the card. Both requirements may result in an increase in the manufacturing cost for the card.

Figure 9:
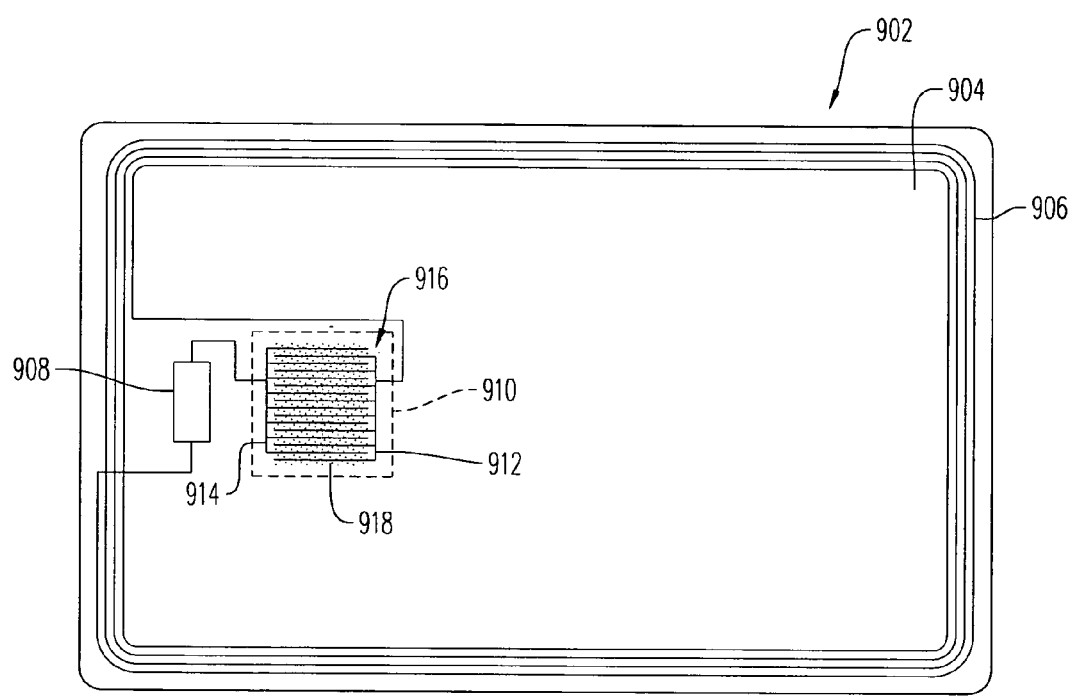
FIG. 9 is a schematic plan view of an inlay portion of a proximity payment card provided in accordance with some embodiments.

FIG. 9 is a schematic plan view of an inlay 902 that may be utilized in accordance with some embodiments in place of the conventional inlay 802. The inlay 902 includes a substrate 904 formed of a conventional material and an antenna 906 and RFID IC 908 embedded in the substrate 908, which serves as a main body for the inlay 902. In addition, a well or recess 910 is formed in the substrate 904. The electrical nodes 912, 914 of a user-actuatable switch 916 are formed in the well 910 and a pressure sensitive material 918, such as QTC, may be printed over the nodes 912, 914 to form the switch 916 as a pressure-sensitive switch. The switch may operate in a binary manner (either on or off) or may provide a signal that indicates a pressure level to the RFID IC 908.

A dimple or the like (not shown) may be incorporated in an outer layer of the card to indicate the location of the switch 916 and to provide tactile feedback as to actuation of the switch 916. Another sort of indication of the location of the switch, such as a printed indication, may also or alternatively be provided on an outer layer of the card.

By incorporating a pressure-sensitive switch in an inlay in the manner illustrated in FIG. 9, and then forming a proximity payment card with such an inlay, it may be possible to incorporate a user-actuatable switch in a proximity payment card while minimizing changes in the manufacturing process, and also minimizing increases in manufacturing cost. An alternative manner of forming an inlay according to some embodiments would be to install in the substrate 904 an RFID module having a switch therein, as shown, e.g., in FIGS. 2-5.

Embodiments have heretofore been described with reference to a card-shaped proximity payment device, but the teachings disclosed herein are also applicable to proximity payment devices which are not card-shaped. As used herein and in the appended claims, "proximity payment device" refers to any device, whether or not card shaped, which transmits to a point of sale terminal, by wireless transmission, a payment account number.

Although not indicated in the drawings, one or more of the proximity payment devices may have a contact interface like that of a conventional smart card that includes a contact interface.

The principles taught herein have heretofore been described in the context of proximity payment devices. Nevertheless, these teachings are also applicable to cards or the like issued by transportation systems (e.g., mass transit systems) for access to the transportation systems; to cards used to identify the holder for purposes apart from or in addition to transaction payments; and to so-called electronic passports (also known as RFID-enabled passports). As used herein and in the appended claims the term "identification token" refers to an object that serves as one or more of a proximity payment device, a transportation card, an identification card and/or an RFID-enabled passport. The term "transportation card" refers to a card or similar device used to pay, or confirm or evidence payment of, a charge for using a transportation system. The term "RFID-enabled passport" refers to an internationally recognized travel document that includes an IC and an antenna and communicates with a terminal by a wireless communication technique.

The above description and/or the accompanying drawings are not meant to imply a fixed order or sequence of steps for any process referred to herein; rather any process may be performed in any order that is practicable, including but not limited to simultaneous performance of steps indicated as sequential.

The proximity payment cards described herein may be considered to be a sort of contactless smart card. The teachings of this application are thus applicable to contactless smart cards generally, as well as to so-called "dual interface" smart cards, which contain a set of contacts on a surface of the card to allow for direct contact interface to a terminal. "Dual interface" smart cards also include an antenna to allow for interfacing to a terminal by wireless transmission of signals.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A radio frequency identification (RFID) module for an identification token, the module comprising:
   a module body;
   an RFID integrated circuit (IC) mounted on or in the module body; and
   a pressure-sensitive switching device mounted on or in the module body;
   wherein the RFID IC is mounted on a first side of the module body and the pressure-sensitive switching device is mounted on a second side of the module body, the second side opposite the first side; and wherein the module body includes via holes formed through the module body to accommodate conductive connections between the pressure-sensitive switching device and the RFID IC.

2. The RFID module of claim 1, further comprising a pair of conductive contact pads formed on the module body and conductively connected to the RFID IC.

3. The RFID module of claim 1, wherein the RFID IC stores at least one payment card account number.

4. The RFID module of claim 1, wherein the pressure-sensitive switching device includes a quantum tunneling composite.

5. The RFID module of claim 1, wherein the RFID IC is centrally located on said first side of the module body and the pressure-sensitive switching device is centrally located on said second side of the module body.

6. An inlay which comprises an inlay body which supports functional components of an identification token, the functional components comprising:
   a radio frequency identification integrated circuit (RFID IC);
   an antenna coupled to the RFID IC; and
   a pressure sensitive switching device coupled to at least one of the RFID IC and the antenna;
   wherein a well is formed in said inlay body, with nodes of said pressure sensitive switching device formed in said well.

7. The inlay of claim 6, wherein the pressure-sensitive switching device includes a quantum tunneling composite.

8. The inlay of claim 6, wherein the RFID IC stores at least one payment card account number.

9. An identification token comprising:
   a card body; and
   a radio frequency identification (RFID) module installed in the card body;
   wherein the RFID module includes:
      a module body;
      an RFID integrated circuit (IC) mounted on or in the module body; and
      a pressure-sensitive switching device mounted on or in the module body;
   wherein the RFID IC is mounted on a first side of the module body and the pressure-sensitive switching device is mounted on a second side of the module body, the second side opposite the first side; and
   wherein the module body includes via holes formed through the module body to accommodate conductive connections between the pressure-sensitive switching device and the RFID IC.

10. The identification token of claim 9, wherein:
    the card body includes an antenna, and
    the RFID module includes a pair of conductive contact pads formed on the module body and conductively connected to the RFID IC and to the antenna.

11. The identification token of claim 9, wherein the RFID IC stores at least one payment card account number.

12. The identification token of claim 9, wherein the pressure-sensitive switching device includes a quantum tunneling composite.

13. The identification token of claim 9, wherein the RFID IC is centrally located on said first side of the module body and the pressure-sensitive switching device is centrally located on said second side of the module body.

14. A card-shaped device comprising an inlay sandwiched between protective layers, the inlay including at least one electrical component and a pressure-sensitive switching device coupled to the electrical component or between the electrical component and a source of power for the electrical component;
    wherein the inlay includes an inlay body which supports the at least one electrical component and the pressure-sensitive switching device, and a well is formed in said inlay body, with nodes of said pressure-sensitive switching device formed in said well.

15. The card-shaped device of claim 14, wherein the pressure-sensitive switching device includes a quantum tunneling composite.

* * * * *